United States Patent
Avci et al.

(10) Patent No.: US 10,651,368 B2
(45) Date of Patent: May 12, 2020

(54) MULTI-BIT-PER-CELL MEMORY DEVICE BASED ON THE UNIDIRECTIONAL SPIN HALL MAGNETORESISTANCE

(71) Applicants: Can Onur Avci, Boston, MA (US); Geoffrey S. D. Beach, Winchester, MA (US)

(72) Inventors: Can Onur Avci, Boston, MA (US); Geoffrey S. D. Beach, Winchester, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/170,992

(22) Filed: Oct. 25, 2018

(65) Prior Publication Data

US 2019/0067561 A1    Feb. 28, 2019

Related U.S. Application Data

(63) Continuation of application No. PCT/US2018/031087, filed on May 4, 2018.
(Continued)

(51) Int. Cl.
*G11C 11/00* (2006.01)
*H01L 43/04* (2006.01)
(Continued)

(52) U.S. Cl.
CPC ............ *H01L 43/04* (2013.01); *G11C 11/161* (2013.01); *G11C 11/1675* (2013.01);
(Continued)

(58) Field of Classification Search
CPC .... G11C 11/161; G11C 11/1675; G11C 11/18
(Continued)

(56) References Cited

U.S. PATENT DOCUMENTS

| 5,635,835 A  * | 6/1997 | Mouchot | ............... | B82Y 10/00 |
|---|---|---|---|---|
|  |  |  |  | 257/E43.004 |
| 7,502,248 B2 * | 3/2009 | Lim | ..................... | B82Y 25/00 |
|  |  |  |  | 365/158 |

(Continued)

OTHER PUBLICATIONS

Avci et al., "A multi-state memory device based on the unidirectional spin Hallmagnetoresistance," Applied Physics Letters 110, 203506, May 18, 2017, 4 pages.
(Continued)

*Primary Examiner* — Huan Hoang
*Assistant Examiner* — Minh Dinh
(74) *Attorney, Agent, or Firm* — Smith Baluch LLP

(57) ABSTRACT

A multilayer structure comprising FM/NM/FM layers enhances the amplitude of the unidirectional spin Hall magnetoresistance (USMR) thanks to an additional FM/NM layer interface. The USMR can be used to detect the in-plane magnetization direction of each FM layer perpendicular to the current injection. Detection relies on second harmonic resistance measurements driven by the USMR with possible contribution of Joule heating-induced magnetothermal effects (ANE and SSE). The four different magnetization states (⇉, ⇄, ⇆, ⇇), of the FM/NM/FM layers give rise to four unique resistance levels, which can be read out by a simple two-terminal electric measurement. As a result, this FM/NM/FM multilayer structure can be used in a lateral, two-terminal device to store multiple magnetic bits. Moreover, the magnetic states can be manipulated by spin-orbit torques, opening the possibility for all-electrical operation.

22 Claims, 11 Drawing Sheets

Related U.S. Application Data

(60) Provisional application No. 62/501,194, filed on May 4, 2017.

(51) Int. Cl.

| | | |
|---|---|---|
| *G11C 11/16* | (2006.01) | |
| *G11C 11/18* | (2006.01) | |
| *G11C 11/56* | (2006.01) | |
| *H01L 43/06* | (2006.01) | |
| *H01L 43/08* | (2006.01) | |
| *H01L 27/22* | (2006.01) | |
| *H01L 43/10* | (2006.01) | |

(52) U.S. Cl.
CPC .......... *G11C 11/18* (2013.01); *G11C 11/5607* (2013.01); *H01L 27/222* (2013.01); *H01L 43/06* (2013.01); *H01L 43/08* (2013.01); *H01L 43/10* (2013.01)

(58) Field of Classification Search
USPC ........................................................ 365/158
See application file for complete search history.

(56) References Cited

U.S. PATENT DOCUMENTS

| | | | | |
|---|---|---|---|---|
| 9,378,761 | B1* | 6/2016 | Seagle | G11B 5/3932 |
| 2016/0372212 | A1* | 12/2016 | Kishi | G11O 29/44 |
| 2017/0018346 | A1* | 1/2017 | Natali | H01F 41/302 |
| 2018/0166500 | A1* | 6/2018 | Wang | H03K 19/177 |

OTHER PUBLICATIONS

Avci et al., "Unidirectional spin Hall magnetoresistance in ferromagnet/normal metal bilayers," Nature Physics, vol. 11, Jun. 8, 2015, 7 pages.
Avci et al., Current-induced switching in a magnetic insulator. Nat Mater. Mar. 2017;16(3):309-314. doi: 10.1038/nmat4812.
Avci et al., Interplay of spin-orbit torque and thermoelectric effects in ferromagnet/normal-metal bilayers. Phys. Rev. B 90, 224427 (2014). 11 pages.
Avci et al., Magnetoresistance of heavy and light metal/ferromagnet bilayers. Appl. Phys. Lett. 107, 192405 (2015).6 pages.
Baibich et al., Giant magnetoresistance of (001)Fe/(001)Cr magnetic superlattices. Phys Rev Lett. Nov. 21, 1988;61(21):2472-2475.
Bhowmik et al., Spin Hall effect clocking of nanornagnetic logic without a magnetic field. Nat. Nanotechnol. 9, 59(2013). 5 pages.
Binasch et al., Enhanced magnetoresistance in layered magnetic structures with antiferromagnetic interlayer exchange. Phys Rev B Condens Matter. Mar. 1, 1989;39(7):4828-4830.
Chappert et al., The emergence of spin electronics in data storage. Nat Mater. Nov. 2007;6(11):813-23.
Cubukcu et al., Spin-orbit torque magnetization switching of a three-terminal perpendicular magnetic tunnel junction. Appl. Phys. Lett. 104, 42406 (2014). 6 pages.
Emori et al., Current-driven dynamics of chiral ferromagnetic domain walls. Nat Mater. Jul. 2013;12(7):611-6. doi: 10.1038/nmat3675. Epub Jun. 16, 2013.
Fan et al., Quantifying interface and bulk contributions to spin-orbit torque in magnetic bilayers. Nat Commun. 2014;5:3042. doi: 10.1038/ncomms4042.
Garello et al., Symmetry and magnitude of spin-orbit torques in ferromagnetic heterostructures. Nat Nanotechnol. Aug. 2013;8(8):587-93. doi: 10.1038/nnano.2013.145. Epub Jul. 28, 2013.
Haazen et al., Domain wall depinning governed by the spin Hall effect. Nat Mater. Apr. 2013;12(4):299-303. doi: 10.1038/nmat3553. Epub Feb. 3, 2018.
International Search Report and Written Opinion in PCT/US2018/031087 dated Aug. 31, 2018, 13 pages.
Kim et al., Layer thickness dependence of the current-induced effective field vector in Ta|CoFeB|MgO, Nat Mater. Mar. 2013;12(3):240-5. doi: 10.1038/nmat3522. Epub Dec. 23, 2012. PubMed PMID: 23263641.
Lavrijsen et al., Asymmetric magnetic bubble expansion under in-plane field in Pt/Co/Pt: Effect of interface engineering. Phys. Rev. B 91, 104414 (2015). 8 pages.
Liu et al., Spin-torque switching with the giant spin Hall effect of tantalum. Science. May 4, 2012;336(6081):555-8. doi: 10.1126/science.1218197.
Miron et al., Perpendicular switching of a single ferromagnetic layer induced by in-plane current injection. Nature. Aug. 11, 2011;476(7359):189-93. doi: 10.1038/nature10309.
Nakayama et al., Spin hall magnetoresistance induced by a nonequilibrium proximity effect. Phys Rev Lett. May 17, 2013;110(20):206601. Epub May 13, 2013, 5 pages.
Nogues et al., Exchange bias. J. Magn. Magn. Mater, 192, 203 (1999). 30 pages.
Olejnik et al., Electrical detection of magnetization reversal without auxiliary magnets. Phys. Rev. B 91, 180402 (2015), 5 pages.
Pai et al., Spin transfer torque devices utilizing the giant spin Hall effect of tungsten. Appl. Phys. Lett. 101, 122404 (2012). 5 pages.
Ryu et al., Chiral spin torque at magnetic domain walls. Nat. Nanotech. 8, 527 (2013). 7 pages.
Sinova et al., Spin Hall effects. Rev. Mod. Phys. 87, 1213 (2015). 47 pages.
Yamanouchi et al., Three terminal magnetic tunnel junction utilizing the spin Hall effect of iridium-doped copper. Appl. Phys. Lett. 102, 212408 (2013). 5 pages.
Yang et al., Spin-orbit torque in Pt/CoNiCo/Pt symmetric devices. Sci Rep. Feb. 9, 2016;6:20778, doi: 10.1038/srep20778, 7 pages.
Yasuda et al., Large Unidirectional Magnetoresistance in a Magnetic Topological Insulator. Phys Rev Lett. Sep. 16, 2016;117(12):127202. Epub Sep. 14, 2016.
Yuasa et al., Giant room-temperature magnetoresistance in single-crystal Fe/MgO/Fe magnetic tunnel junctions. Nat Mater. Dec. 2004;3(12):868-71. Epub Oct. 31, 2004.
Žutić et al., Spintronics: Fundamentals and applications. Rev. Mod. Phys. 76, 323 (2004). 88 pages.

\* cited by examiner

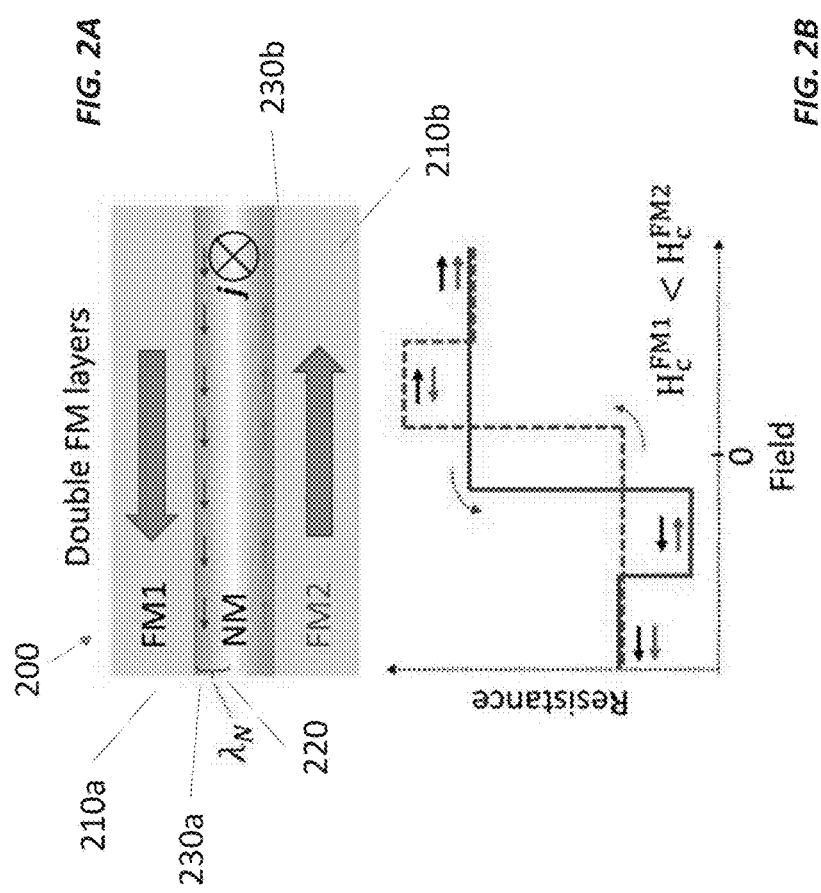
FIG. 2A
FIG. 2B
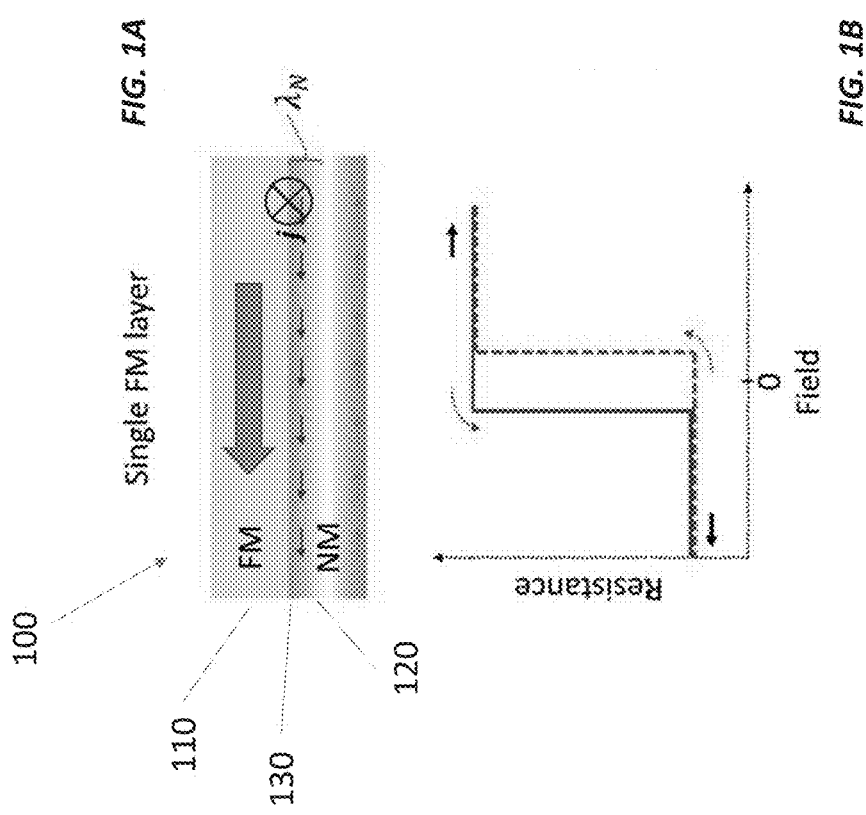
FIG. 1A
FIG. 1B

MULTI-BIT-PER-CELL MEMORY DEVICE BASED ON THE UNIDIRECTIONAL SPIN HALL MAGNETORESISTANCE

CROSS-REFERENCE TO RELATED APPLICATION(S)

This application is a bypass continuation application of International Application PCT/US18/31087, filed May 4, 2018, entitled "Multi-Bit-Per-Cell Memory Device Based On The Unidirectional Spin Hall Magnetoresistance," which claims the priority benefit, under 35 U.S.C. § 119(e), of U.S. Application No. 62/501,194, entitled "Multi-Bit-Per-Cell Memory Device Based on the Unidirectional Spin Hall Magnetoresistance," which was filed on May 4, 2017. Each of these application is incorporated herein by reference in its entirety.

BACKGROUND

Beginning with the discoveries of giant magnetoresistance (GMR) and later tunneling magnetoresistance (TMR), there has been tremendous effort towards understanding the dynamics of the electron spin and its potential use in electronic circuits, leading to the rapidly developing field of spintronics. GMR and TMR provide means for all-electrical readout in magnetic sensors and memory devices based on ferromagnet/spacer/ferromagnet stacks. However, although four distinct stable magnetic states are possible, (⇉, ⇄, ⇆, ⇇) (the arrows indicate the magnetization directions of the two layers), magnetoresistive sensing can only distinguish between two resistance states, parallel and antiparallel. Hence, a conventional magnetoresistive stack has one magnetic layer that remains fixed and serves as a reference layer, rather than to store a bit directly.

Switching of memory cells, such as magnetic tunnel junctions, has conventionally been accomplished by injecting a spin current from the fixed layer to the free layer or vice-versa to exert spin-transfer torque on the free layer. Recently, however, it has been found that spin currents can be more efficiently injected by utilizing the spin Hall effect (SHE) in a nonmagnetic metal (NM) layer 120 adjacent a ferromagnetic (FM) free layer 110 as shown in FIG. 1A. An in-plane charge current $J_{charge}$ near the NM/FM interface 130 leads to a vertical spin current $J_{spin}$ that exerts spin-orbit torques that can be used to efficiently control the magnetization. This has been used to achieve spin-orbit torque switching of the free layer in magnetic tunnel junctions, efficient current-induced domain wall motion, and control of magnetic elements in spin-logic devices.

Recently, the SHE has been shown to also lead to new transport phenomena such as the spin Hall magnetoresistance. Even more recently, a related magnetoresistance effect has been reported in NM/FM bilayers, resulting from the interaction of the current-induced interface spin accumulation due to the spin Hall effect, and the magnetization. This so-called unidirectional spin Hall magnetoresistance (USMR) is a nonlinear and nonreciprocal effect that modulates the longitudinal resistivity depending on the component of the in-plane magnetization vector perpendicular to the current injection direction ($|m_y|$).

The USMR allows for the detection of in-plane magnetization reversal along the axis collinear with the interface spin accumulation without requiring an auxiliary magnetic layer, as depicted in the plot in FIG. 1B. Although this effect can be rather small, e.g., about 0.002%-0.005% of the total resistance in NM/FM bilayers for a current density of $j=10^{11}$ A/m², the chiral property of the USMR distinguishes it from other linear magnetoresistance effects, such as the spin Hall magnetoresistance and anisotropic magnetoresistance, which are both current-independent and proportional to $|m|^2$.

SUMMARY

The USMR and FM/NM/FM stacking can be used to make a memory device that can store multiple bit of information in a single magnetic heterostructure. This memory cell is suitable for dynamic memory applications, including random access memory and cache memory. The USMR makes it possible to detect the magnetic state of each FM layer electrically, which in turn makes it possible to distinguish between the four or more different magnetic states (e.g., (⇉, ⇄, ⇆, ⇇)) in a suitable structure. By controlling the individual FMs by spin-orbit torques, it is possible to build an all-electrical lateral two-terminal multi-bit-per-cell memory device.

The longitudinal resistance of a NM/FM bilayer depends on current and/or in-plane magnetization direction perpendicular to current injection axis. This is due to the interaction of the FM layer with the interface spin accumulation driven by the SHE in the NM layer, hence the name unidirectional spin Hall magnetoresistance (USMR). USMR is capable of detecting the in-plane magnetization reversal along the axis collinear with the interface spin accumulation without requiring an auxiliary magnetic layer. This chiral property of the USMR distinguishes it from other linear magnetoresistance effects, including the giant, tunnel, and anisotropic magnetoresistances, which are both current-independent and proportional to $|m|^2$.

Thus far, the USMR has been reported in bilayer structures where only one interface actively contributes to the effect and two magnetic states are present. The inventors have realized that adding another FM layer in contact with the opposite interface of the NM doubles the effect and makes it possible to detect the magnetization state of each FM layer if their coercivities are different ($H_C^{FM1} \neq H_C^{FM2}$). Such an FM/NM/FM trilayer can be realized by employing a Ta(1)/Co$_{50}$Fe$_{50}$(2)/Pt(3)/Co$_{50}$Fe$_{50}$(2)/NiO(~12) multilayer stack (thicknesses in nanometers). Using a NiO layer increases the coercivity of the top CoFe layer in order to independently control the magnetization of each FM layer. This multilayer stack can be used to make Hall bar structures for measuring the longitudinal resistance harmonically by injecting an alternating current and detecting the second-harmonic voltage. It can be switched selectively among different magnetic configurations using tailored field pulse sequences or spin-orbit torques. These magnetic configurations can be read electrically by USMR as multiple bits.

This multi-bit USMR memory device has several advantages over other magnetoresistive devices. To start, it can store more information per unit volume because each FM layer can actively store information and because it does not need a reference/fixed layer as in the case of GMR or TMR. In addition, it can be readily scaled to higher bit densities by adding layers to the stack, with the bit density scaling as $2^n$, where n is the number of unique FM/NM layer interfaces. For example, combining two NM layers with opposite spin Hall angles with three FM layers with different coercivities, such as a device comprising FM$_1$/Pt/FM$_2$/Ta/FM$_3$, yields a memory cell with eight different magnetization states each with a unique USMR signal. The same effect can be obtained by employing the two NM layers of the same element with different thicknesses to alter the spin Hall properties or modifying their interfaces with the FMs e.g. by inserting an ultrathin spacer layer. And inasmuch as the memory device has NM/FM layers with strong spin-orbit torques, it can be switched with in-plane current instead of with a field. In addition, the lateral device geometry should be easier and less expensive to make than vertical-geometry magnetic tunnel junction devices.

Embodiments of the present technology comprise a memory cell with a magnetoresistive stack and a pair of electrodes in electrical communication with the nonmagnetic layer. The magnetoresistive stack, which may have an aspect ratio of greater than 1:1, includes a first ferromagnetic layer, a second ferromagnetic layer, and a nonmagnetic layer disposed between the first ferromagnetic layer and the second ferromagnetic layer. In operation, the electrodes measure a longitudinal resistance of the magnetoresistive stack.

The magnetoresistive stack may be switchable among at least four stable magnetic states. Each of the four stable magnetic states produces a corresponding distinct modulation of the longitudinal resistance of the nonmagnetic layer via unidirectional spin Hall magnetoresistance. These four distinct stable magnetic states can include: a first state in which a magnetization of the first ferromagnetic layer is pointing in a first direction and a magnetization of the second ferromagnetic layer is pointing in the first direction; a second state in which a magnetization of the first ferromagnetic layer is pointing in the first direction and a magnetization of the second ferromagnetic layer is pointing in a second direction; a third state in which a magnetization of the first ferromagnetic layer is pointing in the second direction and a magnetization of the second ferromagnetic layer is pointing in the first direction; and a fourth state in which a magnetization of the first ferromagnetic layer is pointing in the second direction and a magnetization of the second ferromagnetic layer is pointing in the second direction.

The first ferromagnetic layer can have a first coercivity and the second ferromagnetic layer can have a second coercivity different than the first coercivity. Similarly, the first ferromagnetic layer can comprise a different ferromagnetic material than the second ferromagnetic layer. The first ferromagnetic layer can be thicker than the second ferromagnetic layer. The interface between the first ferromagnetic layer and the nonmagnetic layer can be different than an interface between the second ferromagnetic layer and the nonmagnetic layer.

In some cases, the nonmagnetic layer is a first nonmagnetic layer, and the magnetoresistive stack further comprises a third ferromagnetic layer and a second nonmagnetic layer disposed between the second ferromagnetic layer and the third ferromagnetic layer.

The memory cell may also include a voltage source or a magnetic field source, in electromagnetic with the magnetoresistive stack, to switch the magnetoresistive stack among stable magnetic states.

Other embodiments of the present technology comprise measuring a longitudinal resistance of a magnetoresistive stack comprising a first ferromagnetic layer, a second ferromagnetic layer, and a nonmagnetic layer disposed between the first ferromagnetic layer and the second ferromagnetic layer. This may include measuring one of at least four distinct resistance values via unidirectional spin Hall magnetoresistance, e.g., by sensing a second harmonic voltage across the magnetoresistive stack.

Each of these distinct resistance values corresponds to a different stable magnetic state of at least four stable magnetic states of the magnetoresistive stack. The distinct stable magnetic states may comprise: a first state in which a magnetization of the first ferromagnetic layer is pointing in a first direction and a magnetization of the second ferromagnetic layer is pointing in the first direction; a second state in which a magnetization of the first ferromagnetic layer is pointing in the first direction and a magnetization of the second ferromagnetic layer is pointing in a second direction; a third state in which a magnetization of the first ferromagnetic layer is pointing in the second direction and a magnetization of the second ferromagnetic layer is pointing in the first direction; and a fourth state in which a magnetization of the first ferromagnetic layer is pointing in the second direction and a magnetization of the second ferromagnetic layer is pointing in the second direction.

In some case, the nonmagnetic layer is a first nonmagnetic layer and the magnetoresistive stack further comprises a third ferromagnetic layer and a second nonmagnetic layer disposed between the second ferromagnetic layer and the third ferromagnetic layer. In these cases, measuring the longitudinal resistance comprises measuring one of at least eight distinct resistance values via unidirectional spin Hall magnetoresistance.

The magnetoresistive stack can be switched among the stable magnetic states by applying an in-plane current to the nonmagnetic layer. This in-plane current producing a spin-orbit torque that changes a magnetization of the first ferromagnetic layer or the second ferromagnetic layer. Alternatively, the magnetoresistive stack can be switched among the stable magnetic states with an external magnetic field, for example, by varying the external magnetic field by about ±60 Oe.

Yet another inventive method comprises a method of storing information in a magnetoresistive stack comprising a nonmagnetic layer sandwiched between a first ferromagnetic layer and a second magnetoresistive layer. This method includes injecting a first current pulse into the nonmagnetic layer so as to produce a first spin-orbit torque that causes a magnetization of the first ferromagnetic layer to point in a first direction and injecting a second current pulse having a larger amplitude than the first current pulse into the nonmagnetic layer so as to produce a second spin-orbit torque that causes a magnetization of the second ferromagnetic layer to point in the first direction. It may also include injecting a third current pulse into the nonmagnetic layer so as to produce a third spin-orbit torque that causes the magnetization of the first ferromagnetic layer to point in a second direction and injecting a fourth current pulse having a larger amplitude than the third current pulse into the nonmagnetic layer so as to produce a fourth spin-orbit torque that causes the magnetization of the second ferromagnetic layer to point in the second direction.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1A illustrates Spin Hall Effect (SHE)-induced spin accumulation at the interface between a ferromagnetic (FM) layer and a nonmagnetic (NM) layer. The arrow indicates that the magnetization direction in the FM layer is parallel to the spin accumulation due to the unidirectional spin hall magnetoresistance (USMR).

FIG. 1B is a plot of the change in the longitudinal resistance of the FM/NM layer stack in FIG. 1A depending on the magnetization direction. The arrows indicate the orientation of the magnetization in the FM layer.

FIG. 2A illustrates SHE-induced spin accumulation at the interfaces of an FM/NM/FM layer stack with FM layers having different coercivities.

FIG. 2B is a plot of the resistance of FM/NM/FM layer stack in FIG. 2A. It has four levels instead of two, corresponding to the four different magnetic states indicated by the arrows.

Figures 3A, 3B:
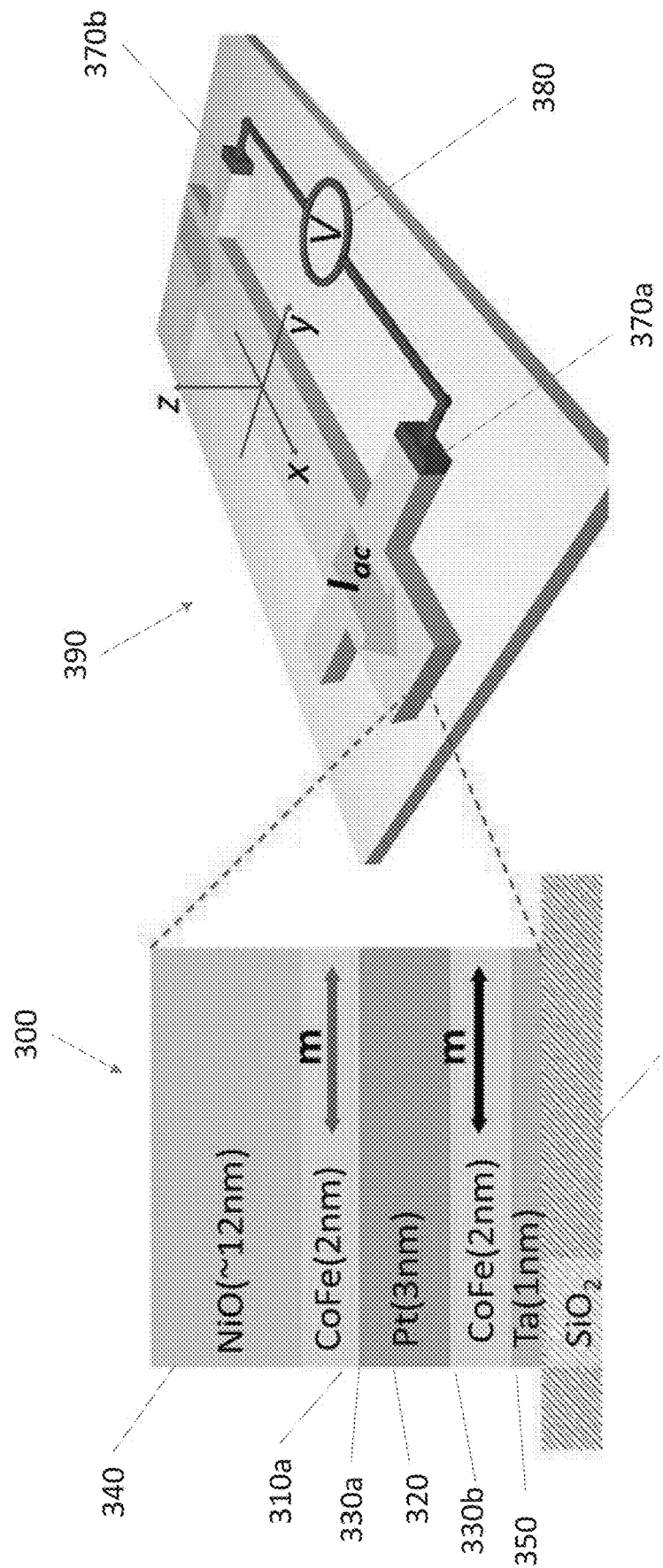
FIG. 3A shows a FM/NM/FM layer structure suitable for use in a multi-bit-per-cell USMR memory device.
FIG. 3B shows a perspective view of a USMR memory device made with the multilayer structure shown in FIG. 3A as well as the device coordinate axes.
Figure 6:
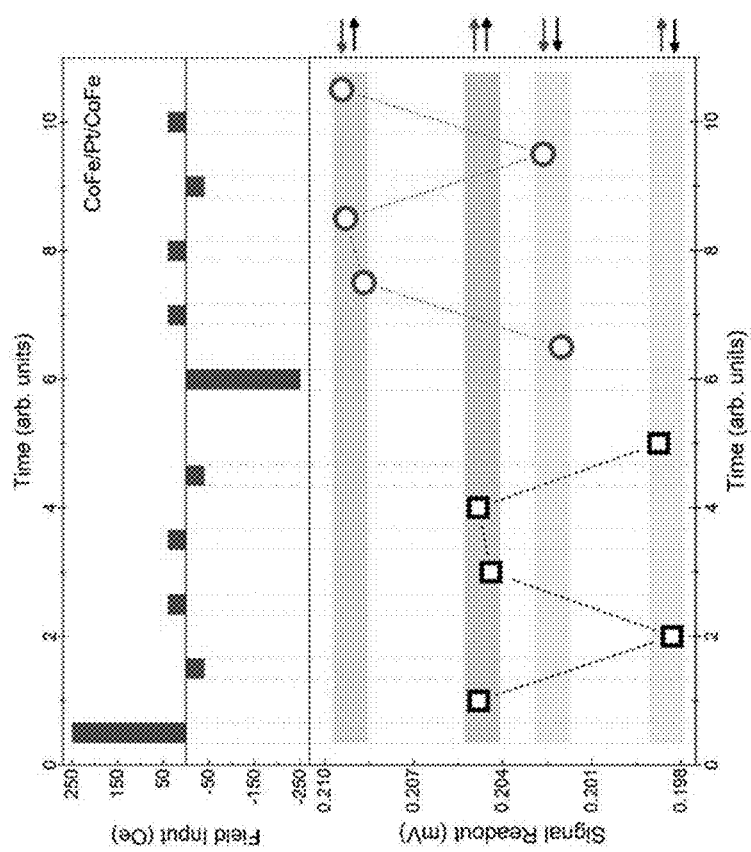

FIG. 6 illustrates a demonstration of the four-state USMR device shown in FIGS. 3A and 3B. Depending on the input field, it is possible to set the system in one of the four states and read the state with the longitudinal $V_{2\omega}$ measurements. The top plot shows the field pulse sequence and the bottom one shows $V_{2\omega}$ measured after the pulse.

Figure 7:
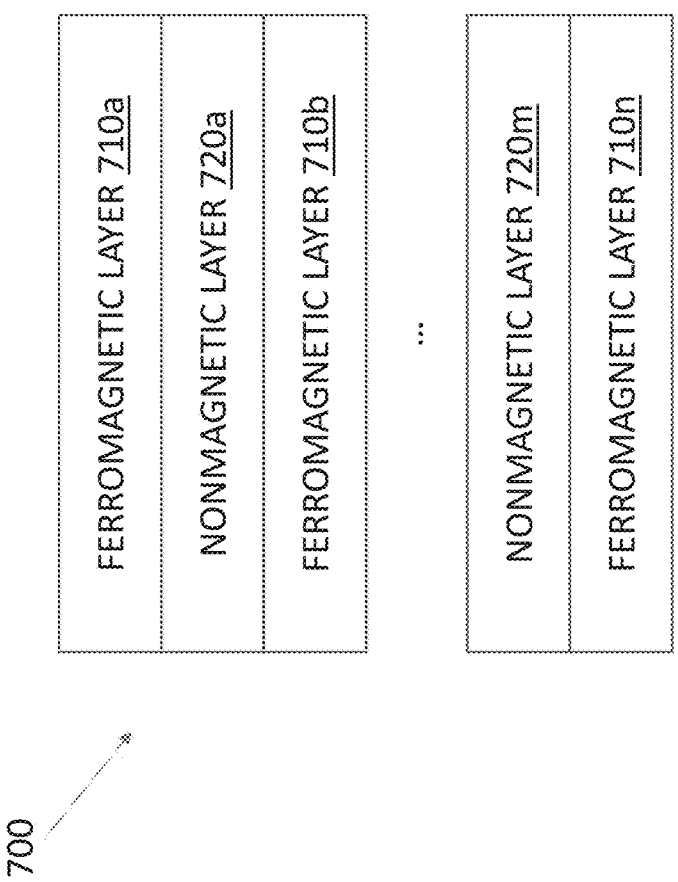

FIG. 7 shows a multi-layer structure suitable for use in a multi-bit-per-cell USMR memory device.

Figure 8A:
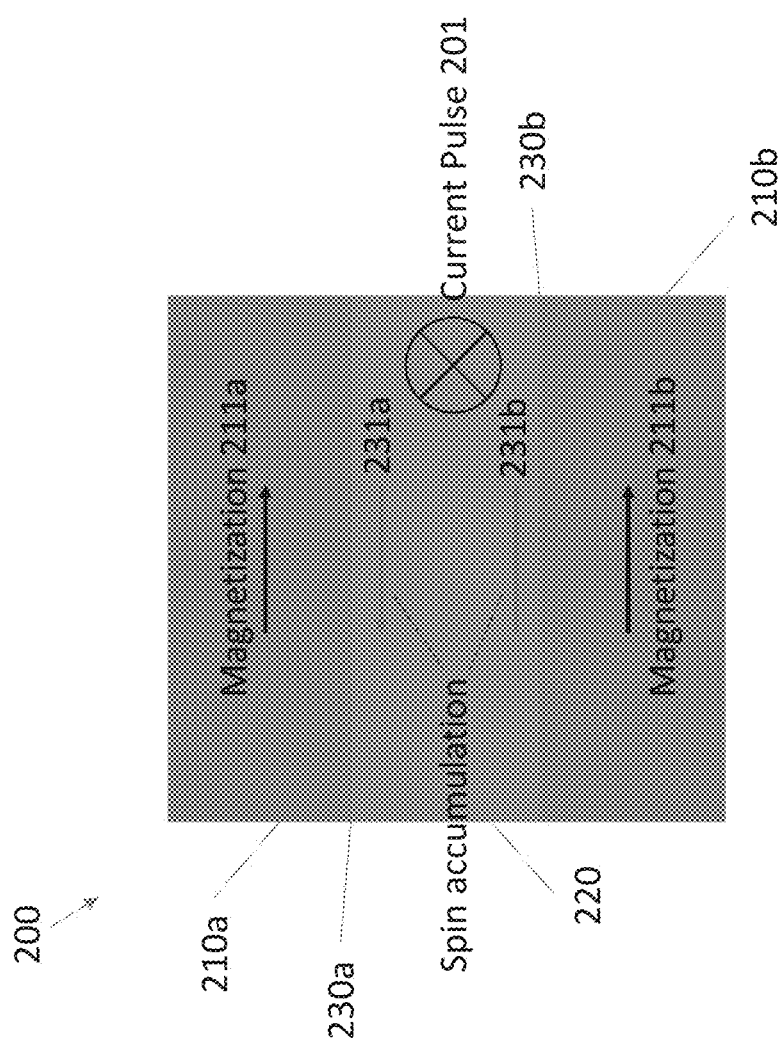
Figure 8B:
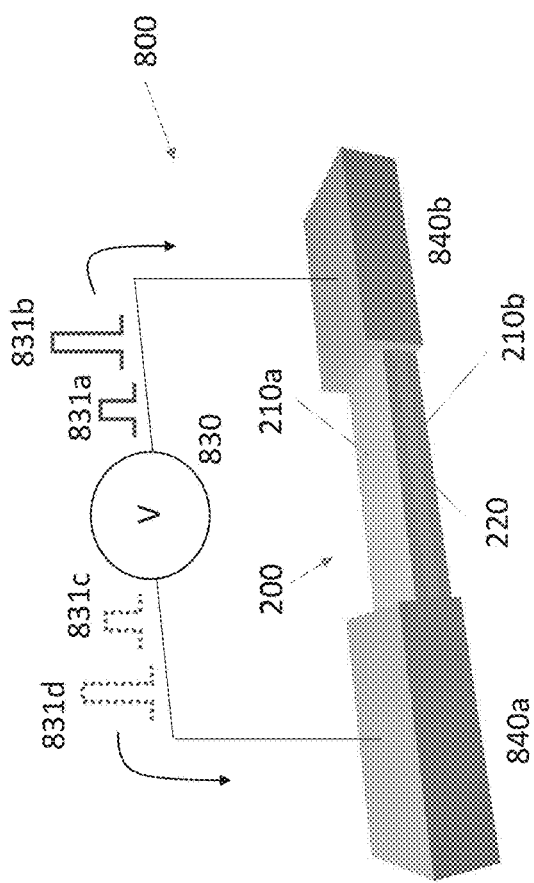
Figure 8B:
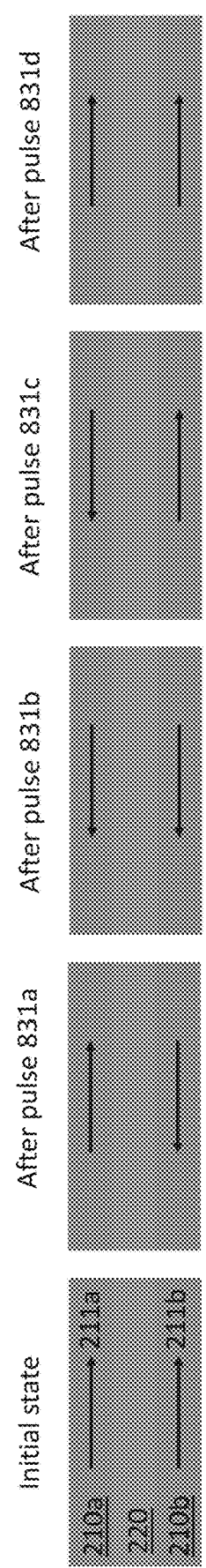

FIGS. 8A and 8B illustrate switching and write operations using spin-orbit torques in a two-terminal memory device with a FM/NM/FM magnetoresistive stack.

Figure 9A:
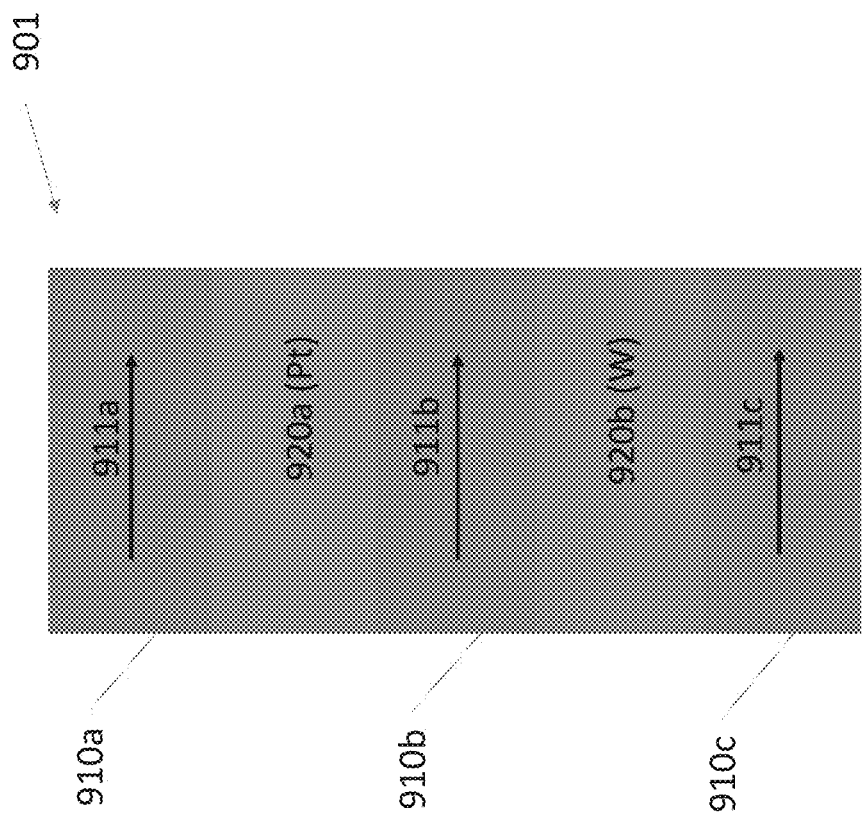
Figure 9B:
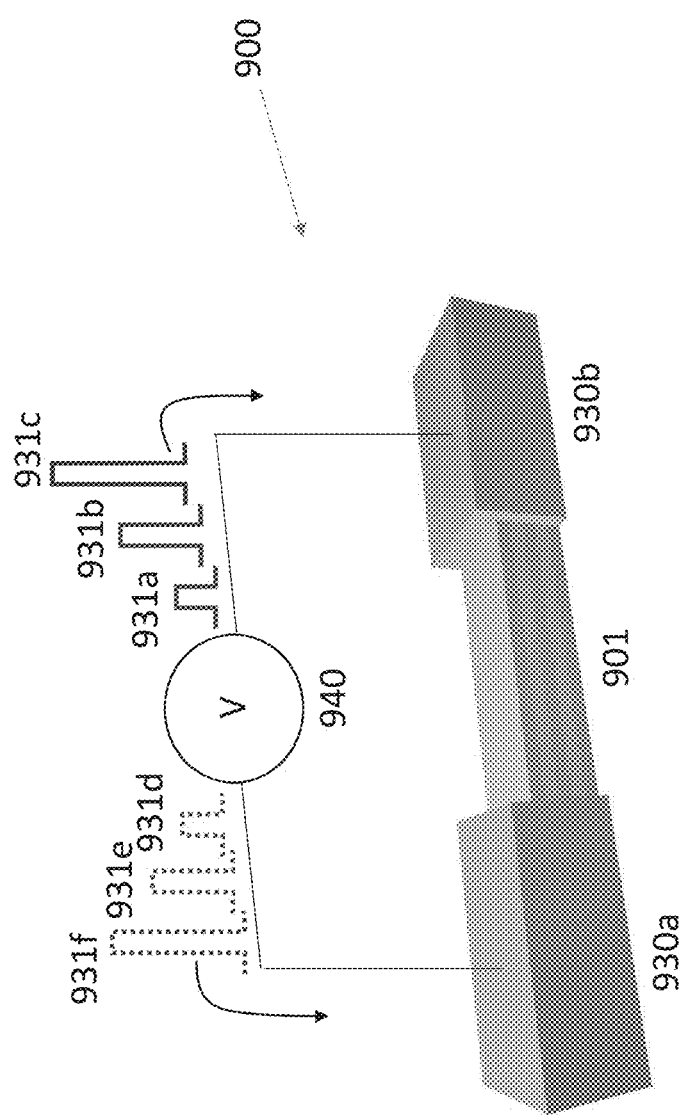
Figure 9B:
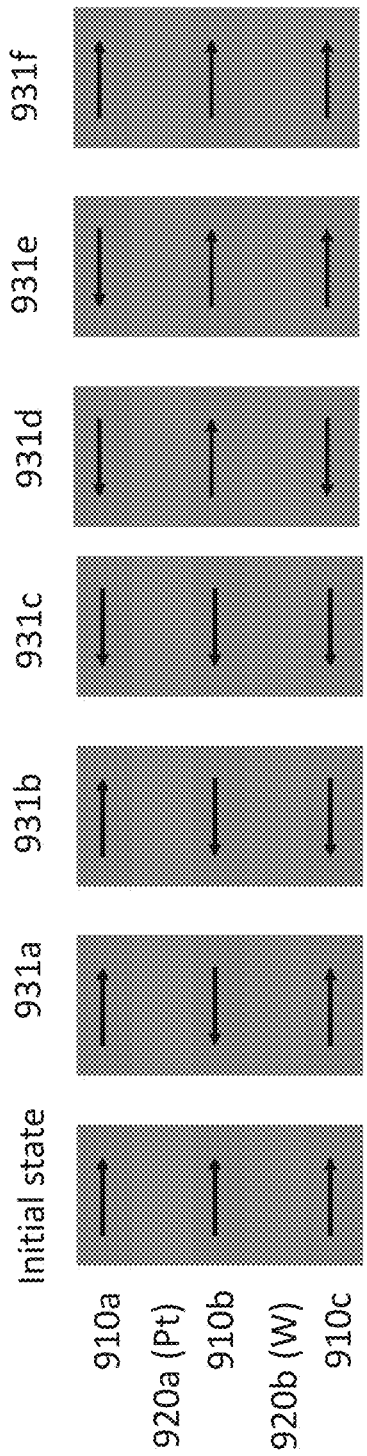

FIGS. 9A and 9B illustrate switching and write operations using spin-orbit torques in a two-terminal memory device with a magnetoresistive stack with five or more layers.

Figure 10:
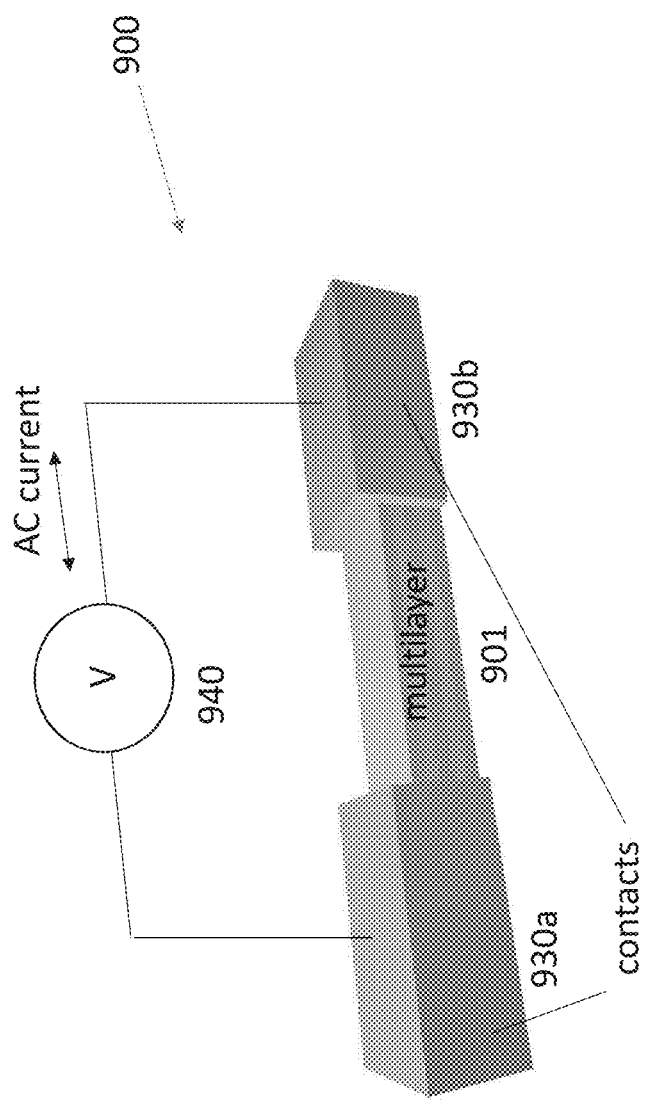

FIG. 10 illustrates a read operation using a second-harmonic longitudinal resistance measurement in a two-terminal memory device with a multilayer magnetoresistive stack.

DETAILED DESCRIPTION

The USMR can allow for the electrical reading of four independent resistance states corresponding to the four distinct magnetic states in a FM/NM/FM stack, allowing realization of magnetic multi-bit-per-cell memories. By adding another FM layer to the NM side of an FM/NM bilayer structure, it is possible to increase the overall amplitude ($\Delta R/R$) of the effect when the magnetization vectors are aligned antiparallel with respect to each other ($\rightleftarrows$), and to detect the magnetization state of each FM if their coercivities are different ($H_C^{FM1} \neq H_C^{FM2}$).

FIG. 2A shows an FM/NM/FM layer structure (magnetoresistive stack) 200 that can be used as the basis for a multi-bit-per-cell memory device read using the USMR. This device 200 includes an NM layer 220 sandwiched between an upper FM layer 210a and a lower FM layer 210b (collectively, FM layers 210). Suitable materials for the FM layers include, but aren't limited to, elemental and alloy ferromagnetic materials, such as Co, Fe, Ni, NiFe, CoFe, and CoFeB. The NM layer 220 converts a charge current into a pure spin current with high efficiency via spin-orbit coupling. It can be made of an elemental heavy metal, such as platinum, tungsten, tantalum, palladium, or an alloy, such as $Bi_2Se_3$, $Bi_2Te_3$, also known as topological insulators.

The FM/NM/FM layer structure 200 can have a lateral aspect ratio of 1:1 or more. The FM/NM/FM layer structure's dimensions and lateral aspect ratio may be selected based on the resistance and relative change in the resistance ($\Delta R$), which scales with the applied current density. Ideally, a large current density should be able to flow through the FM/NM/FM layer structure 200 without dissipating much power but at the same time. If the resistance is small then the absolute value of $\Delta R$ would be small as well. The FM/NM/FM layer structure's exact dimensions and material composition (and hence the exact resistance and $\Delta R$) can be selected based on the desired sensitivity and applied power.

Current propagating in the plane of the NM layer 220 (e.g., into the page as in FIG. 2A) produces spin-orbit torques that can be used to efficiently control the magnetizations of the FM layers 210. These spin-orbit torques can be used to control the magnetizations of the FM layers 210. If the FM layers have different coercivities, e.g., because they are made of different materials or were grown under different conditions, it can be possible to distinguish among all four possible magnetization states ($\rightrightarrows$, $\rightleftarrows$, $\leftleftarrows$, $\leftrightarrows$) of the FM/NM/FM layer structure 200 using the USMR. For example, the upper FM layer 210a may have a coercivity that is about five times that of the lower FM layer 210b. If the lower FM layer's coercivity is greater than about 10 Oe for long-term stability, the upper FM layer's coercivity would be greater than about 50 Oe. Alternatively, or in addition, depositing an ultrathin layer (e.g., 0.5 nm thick) of a different element can be disposed between the NM layer 220 and the FM layer 210 to enhance or reduce the spin transparency of the interface 230. This could be used to offset the nominal USMR effect.

The magnetizations of the FM layers 210 can point in any direction supported by the materials of the FM layers 210. In FIG. 2A, for example, uniaxial FM materials support two directions. However, one or both of the FM layers 210 could have a biaxial or triaxial anisotropy, where the magnetization can be stable at some different angles than 0 and 180 degrees. Since the USMR has an angular dependence that obeys sin φ, where φ is the angle between the current injection and magnetization directions, having magnetization in one of the FM layers at 0 degrees and the magnetization in the other FM layer at 60 degrees would give a different USMR effect then having one magnetization at 0 degrees and the other at 120 degrees. Although the USMR effect is at a maximum when the magnetizations are pointing in opposite directions (e.g., 0 and 180 degrees), the intermediate angles could be used to distinguish between the different magnetization states as well.

FIG. 2B is a plot of a USMR signal measured in the FM/NM/FM layer structure 200 when the coercivity of the upper FM layer 210a is lower than the coercivity of the lower FM layer 210b. The largest (lowest) resistance is obtained when the upper FM layer 210a and the lower FM layer 210b have magnetizations that are parallel (antiparallel) to the spin accumulation of their respective interfaces 230a and 230b with the NM layer 220. In the ideal case, for parallel alignment of the two identical FMs, the USMR of the top and bottom interfaces should cancel each other. However, in real devices, the differences in the spin transmission may occur due to slightly different growth mode, strain state, interface roughness, etc. between the NM material deposited on the FM material and vice versa. Consequently, the interfaces 230 may contribute unevenly to the USMR, as in the case of other spin-orbit-driven effects such as the spin Hall torque and Dzyaloshinskii-Moriya interaction in symmetric Pt/FM/Pt stacks, and produce a net difference between ($\rightrightarrows$) and ($\leftleftarrows$) states.

Moreover, the anomalous Nernst (ANE) and spin Seebeck effects (SSE) due to Joule heating and associated temperature gradient perpendicular to the layer plane produce an additional voltage driven by an electric field with symmetry $E=-\alpha \nabla T \times m$, where $\alpha$ is an effective coefficient taking into account both ANE and SSE. In the parallel configuration ($\rightrightarrows$ or $\leftleftarrows$), when m lies in-plane and perpendicular to the current injection direction, a net difference in the longitudinal voltage should occur between ($\rightrightarrows$) and ($\leftleftarrows$) states. This magnetothermal signal adds to the USMR and can also be effectively used to distinguish between the ($\rightrightarrows$) and ($\leftleftarrows$) states.

Because it is possible to distinguish among all four magnetization states of the FM/NM/FM layer structure 200, the FM/NM/FM layer structure 200 can be used as a memory device to store up to two bits of information (i.e., one bit for each pair of magnetization states). The FM/NM/FM layer structure 200 can be switched between magnetic states by an external magnetic field as low as several tens of Oe (e.g., ±60 Oe for FM layers with coercivities of 10 Oe and 50 Oe). The readout relies on a second-harmonic longitudinal resistance measurement, which probes the USMR and magnetothermal voltages and is highly sensitive to the magnetization orientation of each FM layer 210. A second-harmonic longitudinal resistance measurement involves injecting an alternating current through the FM/NM/FM layer structure 200 and measuring the harmonic components of the longitudinal voltage across the FM/NM/FM layer structure 200. Dividing the longitudinal voltage's amplitude by the injected current yields the harmonic resistances. In such measurements, the first harmonic resistance is current-independent and represents the conventional resistance as measured by standard methods. The second-harmonic resistance is generally current-dependent and incorporates current-induced effects, such as the USMR, and magnetothermal effects, such as the ANE and SSE.

A bit, as represented by a change in magnetic state in at least one of the FM layer 210, can be written with an external magnetic field source or a spin-orbit torque. The switching can be realized by using spin-orbit torques with tailored current pulses to selectively switch the FM layers. The spin accumulation that causes the USMR generates also a damping or antidamping torque on the magnetization, depending on their relative orientations. By using this torque, in the absence of external fields, the ferromagnets can be switched. For a FM/NM/FM stack with parallel magnetizations, the current injection switches the magnetization of one FM layer, yielding an antiparallel magnetization state. If a current of opposite polarity is injected into the NM layer, then both FM layers can switch from one antiparallel configuration to the other antiparallel configuration. If each FM layer has a different switching current threshold, then one can tune the current amplitude to switch either or both FM layers. By tailoring the current pulse amplitude and polarity, one can toggle the FM/NM/FM layers between the magnetization states as shown in FIGS. 8B and 9B.

Writing a bit with a spin-orbit torque and reading the bit with a second-harmonic longitudinal can be performed using the same pair of electrodes, making it possible to fully control a lateral, two-terminal, multi-bit memory device with electrical currents.

FIG. 3A shows a multilayer stack 300 suitable for use in a two-terminal, multi-bit memory device 300. This multilayer stack 300 comprises a 2-nanometer thick $Co_{50}Fe_{50}$ ferromagnetic layer 310a, a 3-nanometer thick Pt nonmagnetic layer 320, a 2-nanometer thick $Co_{50}Fe_{50}$ ferromagnetic layer 310b, and a 1-nanometer thick Ta underlayer 350 formed on a thermally oxidized $SiO_2$ substrate 360 by DC magnetron sputtering. The Ta underlayer 350 serves as a buffer layer and is highly resistive, so its contribution to the conduction can be neglected. A 12-nanometer thick NiO layer 340 is grown reactively on the upper ferromagnetic layer 310a by sputtering Ni in the presence of a partial pressure of about equal to 1.5 mTorr of $O_2$. The NiO layer 340 enhances the coercivity of the upper ferromagnetic layer 310a with respect to the bottom ferromagnetic layer 310b by increasing the domain wall pinning of the upper $Co_{50}Fe_{50}$ layer. The depositions were performed in an in-plane field of about 100 Oe to induce a uniaxial in-plane magnetic anisotropy in the ferromagnetic layers 310a and 310b.

Figure 4:
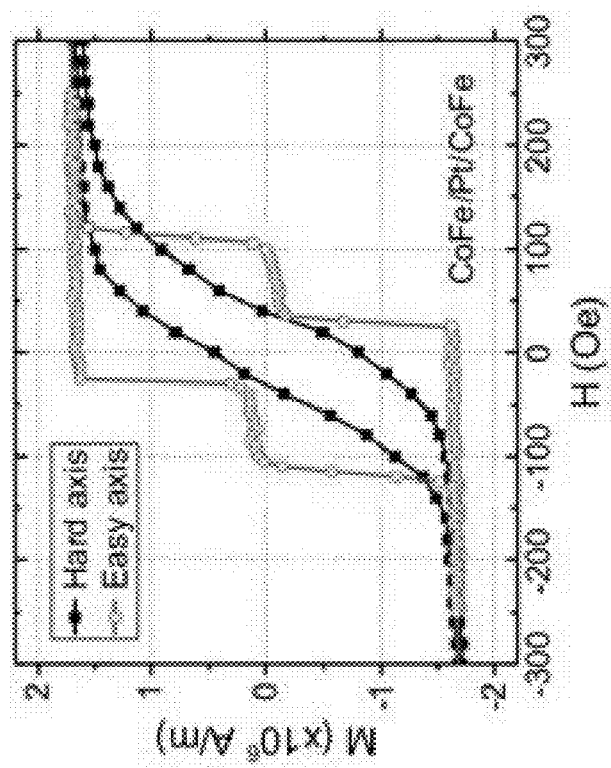
FIG. 4 is a plot of magnetization curves, obtained by vibrating sample magnetometry, of the CoFe/Pt/CoFe layers in the USMR memory device of FIGS. 3A and 3B. Two-step reversal along the easy axis shows that the top and bottom CoFe layers switch at different fields.

FIG. 4 is a plot showing representative easy axis (open boxes) and hard axis (solid boxes) hysteresis loops for the CoFe/Pt/CoFe/NiO multilayer film shown in FIG. 3B. The information in this plot was acquired by vibrating sample magnetometer. Considering 4 nm of total CoFe thickness gives a saturation magnetization value of $1.7 \pm 0.1 \times 10^6$ A/m, which is slightly below the bulk value of CoFe (about $1.95 \times 10^6$ A/m). The hard-axis loop is sheared, while the easy-axis loop exhibits two distinct steps corresponding to switching of the two CoFe layers 310a and 310b. Note that in addition to enhancing the coercivity, the NiO layer 340 induces a small exchange bias resulting in a loop shift along the field axis.

FIG. 3B shows a Hall bar 390 with the multilayer stack 300 structure shown in FIG. 3A. It includes a pair of electrical contacts or electrodes 370a and 370b (collectively, electrodes 370) coupled to a voltage source 380 for performing electrical measurements. The electrodes 370 can be coupled to the entire multilayer stack 300 or to just the NM layer 320. This Hall bar 390 was made using standard optical lithography and lift-off. The layer deposition for the Hall bar 390 was performed simultaneously with the multilayer stack 300 discussed above with respect to FIG. 3A, so its properties are very similar to those of the multilayer stack 300.

The Hall bar 390 was used to probe the USMR and magnetothermal effects. These measurements were made with the longitudinal second harmonic voltage ($V_{2\omega}$) using a standard lock-in method with an ac current density $j_{rms}$ of about $10^{10}$ A/m², frequency 1916 Hz and with field $H_y$ swept along the y-axis. To improve signal-to-noise at the low probing current densities used, data were averaged over about 100 field sweep cycles. All measurements were performed at room temperature.

Figures 5A, 5B:
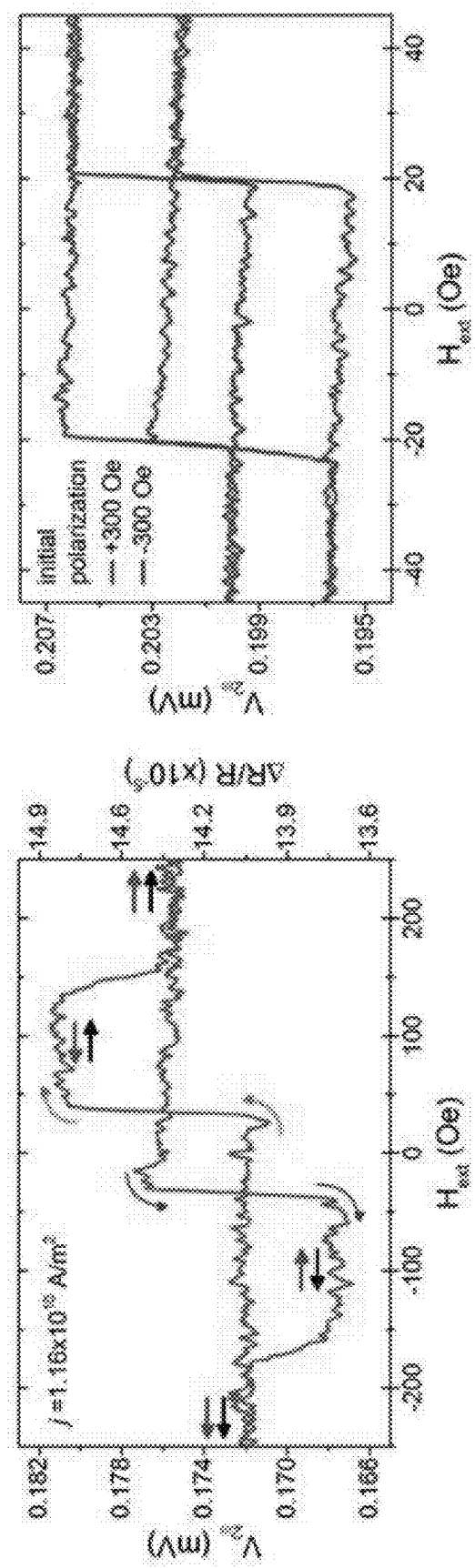
FIG. 5A is a plot of the voltage difference, measured during a field sweep along the y-axis, corresponding to the four different magnetic states of the CoFe/Pt/CoFe multilayers in the USMR memory device of FIGS. 3A and 3B.
FIG. 5B is a plot of minor loops measured after initial polarization of the top CoFe layer multilayers in the USMR memory device of FIGS. 3A and 3B with ±300 Oe. Depending on the magnetization orientation of the top CoFe layer, the overall signal shifts vertically demonstrating that it is possible to obtain four stable signal levels at zero field.

FIG. 5A shows $V_{2\omega}$ (versus $H_y$ for the CoFe/Pt/CoFe Hall bar 390, with $j_{rms}=1.16\times10^{10}$ A/m$^2$. The sample exhibits four distinct $V_{2\omega}$ signal levels corresponding to four different magnetization states ($\rightrightarrows$, $\leftleftarrows$, $\rightleftarrows$, $\leftrightarrows$). The data closely resembles the behavior expected from the USMR and magnetothermal effects as shown in FIG. 2B. There is a large difference in $V_{2\omega}$ between the two antiparallel states ($\rightleftarrows$, $\leftrightarrows$) where the USMR, $\Delta R_{usmr}$, is expected to be maximum and the magnetothermal effect vanishes by symmetry. Extrapolation of the data to $j=10^{11}$ A/m$^2$ (for comparison with results in the scientific literature) yields $\Delta R/R \cong 7\times10^{-5}$ which is more than two times larger than a Pt(3)/Co(2.5) bilayer, and represents the largest USMR effect obtained so far in all-metallic layers. However, even in the antiparallel configuration, a non-zero magnetothermal effect might be present if $\nabla T$ experienced by each FM layer is different. For instance, it is possible that the bottom CoFe layer 310b, being closer to the substrate, experiences a larger temperature gradient and produces a higher magnetothermal signal with respect to the top CoFe layer 310a. As a result, the USMR contribution might be lower or higher than this value depending on the difference of the thermal gradients across the two FM layers.

FIG. 5B is a plot showing measurements of the four $V_{2\omega}$ states for a CoFe/Pt/CoFe magnetoresistive stack. This plot illustrates independent programming of the four $V_{2\omega}$ states by initially configuring the top FM layer with a large external magnetic field (in excess of its larger coercivity He), and then switching the bottom FM layer by cycling through a minor magnetic field loop. More particularly, prior to the measurements, a field of +300 Oe or −300 Oe was applied to set the top CoFe magnetization direction. Then, the field was swept between ±45 Oe. The curves in FIG. 5B shift vertically depending on the orientation of the top CoFe layer, making it possible to resolve four different signal levels at zero external field.

FIG. 6 shows selective switching between different magnetic configurations using tailored field pulse sequences, and subsequent electrical readout of those states. The upper and lower panels show the field input and the signal output, respectively, in the absence of the field. Here, a field larger than 200 Oe is used to set the magnetization of the top FM layer, followed by a field magnitude of 30 Oe that sets the orientation or the magnetization of the bottom FM layer.

The signal levels in this device, while sufficient to distinguish the four states, can be optimized further. For instance, injecting a larger current increases the $V_{2\omega}$ output. Since $V_{2\omega}$ scales with $I^2$, increasing the applied current tenfold, i.e., to the $10^{11}$ A/m$^2$ range, results in an enhancement of two orders of magnitude in $V_{2\omega}$. Optimization of the layer thicknesses, FM material choice, and device design could increase the output voltage even further. Another possibility is to use other high spin-orbit materials instead of conventional heavy metals. Suitable spin-orbit materials include topological insulators, such as $Bi_2Se_3$ or $Bi_2Te_3$, and alloys (e.g., CuBi, AgBi, AuW, CuW) with large spin-orbit coupling. For instance, using semiconductors and topological insulators with large charge-spin conversion could substantially boost the USMR signals.

Moreover, an inventive multi-bit memory can be scaled to higher bit densities by including additional layers in the stack. By combining NM layers with opposite spin Hall angles and FM layers with different coercivities, such as a device comprising FM1/Pt/FM2/Ta/FM3, one could realize eight different magnetization states, each with a unique $V_{2\omega}$ signal.

FIG. 7 shows a multilayer structure (magnetoresistive stack) 700 for multi-layer memory that can store more than two bits of information. It includes NM layers 720a . . . 720m (collectively, NM layers 720) sandwiched between respective FM layers 710a . . . 710n (collectively, FM layers 710). Each FM layer 710 has a different coercivity so that switching the orientation of a given FM layer's magnetization produces a unique change in the multilayer structure's resistance. The different coercivities can be achieved by making the FM layers 710 or NM layers 720 of different materials, different thicknesses, and/or different boundary conditions. The FM layers' magnetizations can switched by applying an external magnetic field or by running an in-plane current through the structure via electrodes (not shown) attached to opposite edges of the multilayer structure 700.

FIGS. 8A and 8B illustrates how to switch the magnetizations of the FM layers 210 in the trilayer stack 200 of FIG. 2 with spin-orbit torques. A current pulse 201 propagating in the plane of the NM layer 220 produces spin accumulations 231a and 231b at the upper and lower interfaces 230a and 230b, respectively. The FM layers 210a and 210b have magnetizations 211a and 211b, respectively, that tend to align with the spin accumulations 231a and 231b if the spin accumulations are large enough. Since there are several sources of the spin accumulation in such structures (e.g., the spin Hall effect, Rashba-Edelstein effect), these sources are collectively called spin-orbit torques. Spin accumulation scales with the current density through the NM layer 220 (e.g., Pt), so it is possible to switch the magnetizations 211a and 211b selectively by choosing the amplitude of the current pulse 201.

FIG. 8B shows a two-terminal memory device 800 that writes bits in the trilayer stack 200 using spin-orbit torques induced by a sequence of large and small current pulses. These current pulses are applied using electrodes 840a and 840b that connect a voltage source 830 to the sides of the trilayer stack 200. To start, the magnetization states of the FM layers 210 are parallel and pointing to the right. If the bottom FM layer 210b is "softer" than the upper FM layer 210a (i.e., the bottom FM layer 210b has a lower coercivity than the upper FM layer 210a), its magnetization can be switched to point to the left by a current pulse 831a that propagates from electrode 840b, through the NM layer 220, to electrode 820a. Applying a larger current pulse 831b in the same direction causes the magnetization of the upper (harder) FM layer 210a to point to the left as well. Applying a small current pulse 831c in the reverse direction (i.e., from electrode 840a to electrode 840b) flips the magnetization of the lower (softer) FM layer 210b to point to the right. And applying a large current pulse 831d in the reverse direction flips the magnetization of the upper (harder) FM layer 210a to point to the right.

It is possible to switch an in-plane magnet by using spin-orbit torques with current pulses (e.g., pulses 831a-831d) that are several nanoseconds long. The current amplitude scales with the pulse width and the magnetic volume to be switched, but typically a long pulse (e.g. millisecond-long) of density $\sim10^{11}$ A/m$^2$ is suitable for switching 1-2 nm of FM layer. For nanosecond-long pulses, the amplitudes may increase to $\sim10^{12}$ A/m$^2$. These amplitudes and durations scale with tunable parameters such as the coercivities and the FM thicknesses, as such making it possible to switch each FM layer separately.

FIGS. 9A and 9B show how to write bits to a two-terminal memory device 900 with a five-layer magnetoresistive stack 901 using spin-orbit torques. In this case, the magnetoresistive stack includes a platinum NM layer 920a and a tungsten NM layer 920b sandwiched between FM layers 910a, 910b, and 920c as shown in FIG. 9A. Using different materials for the NM layers 920 breaks switching symmetry, making it possible to distinguish among the different possible magnetization states of the FM layers 910.

In this case, the direction of the spin accumulation or spin-orbit torques for a given current direction depends on the material of the NM layer 920. For instance, tungsten (and tantalum) produces spin-orbit torques opposite to those of platinum. This means that the layers could be stacked in a way that the middle FM layer 910b could be switched with the collective action of the top NM layer 920a (e.g., Pt) and bottom NM layer 920b (e.g., W). Alternatively, the NM layers 920 may be made of the same material (e.g., Pt) but have different thicknesses such that the spin accumulations at the top and bottom interfaces of the middle FM layer 910b are different. The interfaces between layers, FM materials, thicknesses of the FM layers, and current pulse amplitudes can also be selected to control each FM layer's magnetization individually.

FIG. 9B illustrates the memory device 900 with the NM layer s920 in the five-layer magnetoresistive stack 901 coupled to a voltage source 940 via electrodes 930a and 930b. If the memory device 900 starts with the magnetizations of the FM layers 910 pointing right, injecting forward current pulses 931a-931c of increasing amplitude causes the magnetizations to point left, starting with the middle (lowest coercivity) FM layer 910b, then the bottom FM layer 910c, and finally the top (highest coercivity) FM layer 910a. Once the magnetizations are all pointing left, they can be switched to point right by reverse current pulses 931d-931f of increasing amplitude, again starting with the middle FM layer 910b, then the bottom FM layer 910c, and finally the top FM layer 910a.

FIG. 10 illustrates a read operation for a two-terminal memory device with a magnetoresistive stack (in this case, the memory device 900 from FIG. 9B). The voltage source 940 injects an alternating current into the magnetoresistive stack 901 and measures the second harmonic component of the AC voltage across the magnetoresistive stack 901 via the electrodes 930 as described above. The resistance corresponds uniquely to the magnetoresistive stack's magnetization state, making it possible to reading the bit(s) stored by the memory device 900. Because current generation and voltage reading can be done via the same electrodes 930, so this device 900 is a two-terminal device.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A memory cell comprising:
    a magneto resistive stack comprising a first ferromagnetic layer, a second ferromagnetic layer, and a nonmagnetic layer disposed between the first ferromagnetic layer and the second ferromagnetic layer; and
    a pair of electrodes, in electrical communication with the nonmagnetic layer, to measure a longitudinal resistance of the magneto resistive stack,
    wherein the magneto resistive stack is switchable among at least four stable magnetic states, each of the at least four stable magnetic states producing a corresponding distinct modulation of the longitudinal resistance of the nonmagnetic layer via unidirectional spin Hall magnetoresistance.

2. The memory cell of claim 1, wherein the at least four stable magnetic states comprise:
    a first state in which a magnetization of the first ferromagnetic layer is pointing in a first direction and a magnetization of the second ferromagnetic layer is pointing in the first direction;
    a second state in which a magnetization of the first ferromagnetic layer is pointing in the first direction and a magnetization of the second ferromagnetic layer is pointing in a second direction;
    a third state in which a magnetization of the first ferromagnetic layer is pointing in the second direction and a magnetization of the second ferromagnetic layer is pointing in the first direction; and
    a fourth state in which a magnetization of the first ferromagnetic layer is pointing in the second direction and a magnetization of the second ferromagnetic layer is pointing in the second direction.

3. The memory cell of claim 1, wherein the magneto resistive stack has an aspect ratio of greater than 1:1.

4. The memory cell of claim 1, wherein the first ferromagnetic layer has a first coercivity and the second ferromagnetic layer has a second coercivity different than the first coercivity.

5. The memory cell of claim 4, wherein the first ferromagnetic layer and the second ferromagnetic layer are formed from the same ferromagnetic material and the magneto resistive stack further comprises:
    a coercivity enhancement layer, disposed on the first ferromagnetic layer, to make the first coercivity greater than the second coercivity.

6. The memory cell of claim 4, wherein the first coercivity is at least about 10 Oe and the second coercivity is at least about 60 Oe.

7. The memory cell of claim 1, wherein the first ferromagnetic layer comprises a different ferromagnetic material than the second ferromagnetic layer.

8. The memory cell of claim 1, wherein the first ferromagnetic layer is thicker than the second ferromagnetic layer.

9. The memory cell of claim 1, wherein an interface between the first ferromagnetic layer and the nonmagnetic layer is different than an interface between the second ferromagnetic layer and the nonmagnetic layer.

10. The memory cell of claim 9, further comprising:
    a layer, disposed between the first ferromagnetic layer and the nonmagnetic layer, to change a spin transparency of the interface between the first ferromagnetic layer and the nonmagnetic layer with respect to a spin transparency of the interface between the second ferromagnetic layer and the nonmagnetic layer.

11. The memory cell of claim 1, wherein the nonmagnetic layer is a first nonmagnetic layer, and the magneto resistive stack further comprises:
    a third ferromagnetic layer; and
    a second nonmagnetic layer disposed between the second ferromagnetic layer and the third ferromagnetic layer.

12. The memory cell of claim 11, wherein the pair of electrodes is used to apply an in-plane current pulse having a first current direction,
    wherein the first nonmagnetic layer is formed from a first material having a first direction of spin accumulation corresponding to the first current direction and the second nonmagnetic layer is formed from a second material having a second direction of spin accumulation corresponding to the first current direction, and
    wherein the first direction of spin accumulation is opposite to the second direction of spin accumulation.

13. The memory cell of claim 1, further comprising:
    a voltage source, in electrical communication with the magneto resistive stack via the pair of electrodes, to switch the magneto resistive stack among stable magnetic states.

14. A method comprising:
    measuring a longitudinal resistance of a magneto resistive stack comprising a first ferromagnetic layer, a second ferromagnetic layer, and a nonmagnetic layer disposed between the first ferromagnetic layer and the second ferromagnetic layer,
    wherein measuring the longitudinal resistance comprises measuring one of at least four distinct resistance values via unidirectional spin Hall magnetoresistance, each of the at least four distinct resistance values corresponding to a different stable magnetic state of at least four stable magnetic states of the magneto resistive stack.

15. The method of claim 14, wherein the at least four stable magnetic states comprise:
- a first state in which a magnetization of the first ferromagnetic layer is pointing in a first direction and a magnetization of the second ferromagnetic layer is pointing in the first direction;
- a second state in which a magnetization of the first ferromagnetic layer is pointing in the first direction and a magnetization of the second ferromagnetic layer is pointing in a second direction;
- a third state in which a magnetization of the first ferromagnetic layer is pointing in the second direction and a magnetization of the second ferromagnetic layer is pointing in the first direction; and
- a fourth state in which a magnetization of the first ferromagnetic layer is pointing in the second direction and a magnetization of the second ferromagnetic layer is pointing in the second direction.

16. The method of claim 14, wherein:
- the nonmagnetic layer is a first nonmagnetic layer and the magneto resistive stack further comprises a third ferromagnetic layer and a second nonmagnetic layer disposed between the second ferromagnetic layer and the third ferromagnetic layer, and
- measuring the longitudinal resistance comprises measuring one of at least eight distinct resistance values via unidirectional spin Hall magnetoresistance.

17. The method of claim 14, further comprising:
- switching the magneto resistive stack among the at least four stable magnetic states by applying an in-plane current to the nonmagnetic layer, the in-plane current producing a spin-orbit torque that changes a magnetization of at least one of the first ferromagnetic layer or the second ferromagnetic layer.

18. The method of claim 17, wherein at least one of the amplitude or the polarity of the in-plane current pulse is adjusted to select a stable magnetic state among the at least four stable magnetic states.

19. The method of claim 17, wherein measuring the longitudinal resistance is performed using a pair of electrodes in electrical communication with at least the nonmagnetic layer and applying the in-phase current to the nonmagnetic layer is performed using the pair of electrodes.

20. The method of claim 14, further comprising:
- switching the magneto resistive stack among the at least four stable magnetic states with an external magnetic field.

21. The method of claim 20, further comprising:
- varying the external magnetic field by about ±60 Oe.

22. The method of claim 14, wherein measuring the longitudinal resistance comprises measuring a second harmonic voltage across the magneto resistive stack.

\* \* \* \* \*